United States Patent
Bae

(10) Patent No.: US 11,036,433 B2
(45) Date of Patent: Jun. 15, 2021

(54) MEMORY CONTROLLER, DATA STORAGE DEVICE, AND STORAGE SYSTEM HAVING THE SAME

(71) Applicant: SK hynix Inc., Icheon-si (KR)

(72) Inventor: Sang Geun Bae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/511,692

(22) Filed: Jul. 15, 2019

(65) Prior Publication Data
US 2020/0150900 A1 May 14, 2020

(30) Foreign Application Priority Data
Nov. 13, 2018 (KR) .................. 10-2018-0138826

(51) Int. Cl.
*G06F 3/06* (2006.01)
*G11C 11/4096* (2006.01)
*G11C 11/4076* (2006.01)

(52) U.S. Cl.
CPC .......... *G06F 3/0659* (2013.01); *G06F 3/0604* (2013.01); *G06F 3/068* (2013.01); *G06F 3/0656* (2013.01); *G11C 11/4076* (2013.01); *G11C 11/4096* (2013.01)

(58) Field of Classification Search
CPC .... G06F 3/0659; G06F 3/0604; G06F 3/0656; G06F 3/068; G11C 11/4096; G11C 11/4076

USPC .......................................................... 711/154
See application file for complete search history.

(56) References Cited

U.S. PATENT DOCUMENTS

2018/0166122 A1* 6/2018 Eom .................... G11C 7/1084
2019/0103154 A1* 4/2019 Cox .................... G11C 7/1072

FOREIGN PATENT DOCUMENTS

KR   1020060052236 A   5/2006
KR   1020070056110 A   5/2007

\* cited by examiner

*Primary Examiner* — Hua J Song
(74) *Attorney, Agent, or Firm* — William Park & Associates Ltd.

(57) ABSTRACT

A memory controller includes a plurality of control signal pads and selectively controls a first-type memory and a second-type memory. The memory controller also includes a control signal generation unit configured to generate a control signal for controlling a selected memory. The memory controller further includes a control signal transfer unit configured to apply bits of a first control signal generated for controlling the first-type memory to respective control signal pads of the plurality of control signal pads, apply bits of a second control signal generated for controlling the second-type memory to a first control signal pad group selected among the plurality of control signal pads, and apply the second control signal to a second control signal pad group which is selected among the plurality of control signal pads independently of the first control signal pad group.

17 Claims, 14 Drawing Sheets

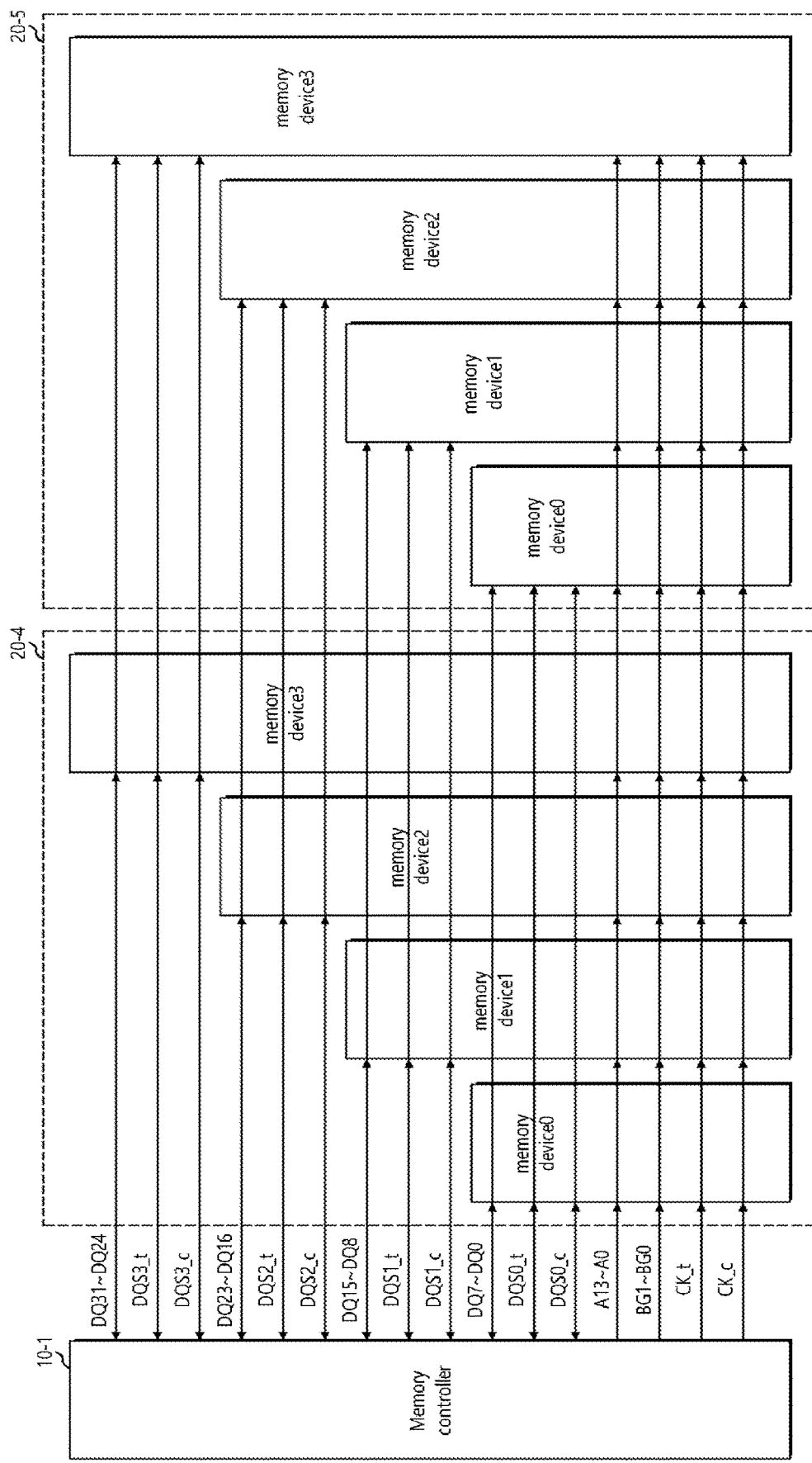

MEMORY CONTROLLER, DATA STORAGE DEVICE, AND STORAGE SYSTEM HAVING THE SAME

CROSS-REFERENCES TO RELATED APPLICATION

The present application claims priority under 35 U.S.C. § 119(a) to Korean patent application number 10-2018-0138826 filed on Nov. 13, 2018, in the Korean Intellectual Property Office, which is incorporated herein by reference in its entirety.

BACKGROUND

1. Technical Field

Various embodiments of the present disclosure generally relate to a semiconductor integrated device, and more particularly to a memory controller, and a data storage device and storage system having the same.

2. Related Art

A memory controller is implemented to control a memory to perform, for example, data read/write operations.

In order to perform such operations, a bandwidth may be set aside for data communication between a memory controller and the memory being controlled.

A memory controller may be equipped with various control modes to control various memory types by selecting the appropriate control mode according to the type of the mounted memory that is in communication with the memory controller.

For an electronic device having a memory controller, a performance factor may be determined by the signal transfer rate between the memory controller and the memory being controlled. Therefore, the loads of signal lines between a memory controller and the memory being controlled may affect the performance and efficiency.

SUMMARY

In accordance with an embodiment of the present teachings, a memory controller is operably connectable to different type memories including a first-type memory and a second-type memory via a plurality of control signal pads including a first control signal pad group, configured to be connected with the first-type memory, and a second control signal pad group, configured to be connected with the second-type memory. The memory controller includes a control signal generation unit configured to generate a control signal including a first control signal and a second control signal configured to control the first-type memory and the second-type memory. The memory controller also includes a control signal transfer unit configured to selectively control one of the first-type memory and the second-type memory. The first-type memory is controlled by applying bits of the first control signal to the first control signal pad group and the second control signal pad group of the control signal pads. The second-type memory is controlled by applying bits of the second control signal to the first control signal pad group of the control signal pads, and applying the second control signal to the second control signal pad group of the control signal pads independently of the first control signal pad group.

In accordance with another embodiment of the present teachings, a data storage device includes a storage unit, a buffer memory unit configured to store data inputted to/outputted from the storage unit, and a memory controller configured to control data input/output for the buffer memory unit. The memory controller is operably connectable to different type memories including a first-type memory and a second-type memory via a plurality of control signal pads including a first control signal pad group, configured to be connected with the first-type memory, and a second control signal pad group, configured to be connected with the second-type memory. The memory controller includes a control signal generation unit is configured to generate a control signal including a first control signal and a second control signal configured to control the first-type memory and the second-type memory. The memory controller also includes a control signal transfer unit configured to selectively control one of the first-type memory and the second type-memory. The first-type memory is controlled by applying bits of the first control signal to the first control signal pad group and the second control signal pad group of the control signal pads. The second-type memory is controlled by applying bits of the second control signal to the first control signal pad group of the control signal pads, and applying the second control signal to the second control signal pad group of the control signal pads independently of the first control signal pad group.

In accordance with another embodiment of the present teachings, a storage system includes a host device and a data storage device. The data storage device includes a storage unit, a buffer memory unit configured to store data inputted to/outputted from the storage unit, and a controller including a memory controller configured to control data input/output for the buffer memory and including a plurality of control signal pads to selectively control a first-type memory and a second-type memory. The memory controller includes a control signal generation unit configured to generate a control signal including a first control signal, configured to control the first-type memory, and a second control signal, configured to control the second-type memory. The memory controller also includes a control signal transfer unit configured to apply bits of the first control signal generated for controlling the first-type memory to respective control signal pads of the plurality of control signal pads, apply bits of the second control signal generated for controlling the second-type memory to a first control signal pad group selected among the plurality of control signal pads, and apply the second control signal to a second control signal pad group selected among the plurality of control signal pads independently of the first control signal pad group.

BRIEF DESCRIPTION OF THE DRAWINGS

FIGS. 5A to 5E illustrate memory devices in accordance with various embodiments of the present disclosure.

DETAILED DESCRIPTION

Hereinafter, a memory controller, a data storage device, and storage system having the same according to the present disclosure are described below with reference to the accompanying drawings through various embodiments.

Figure 1:
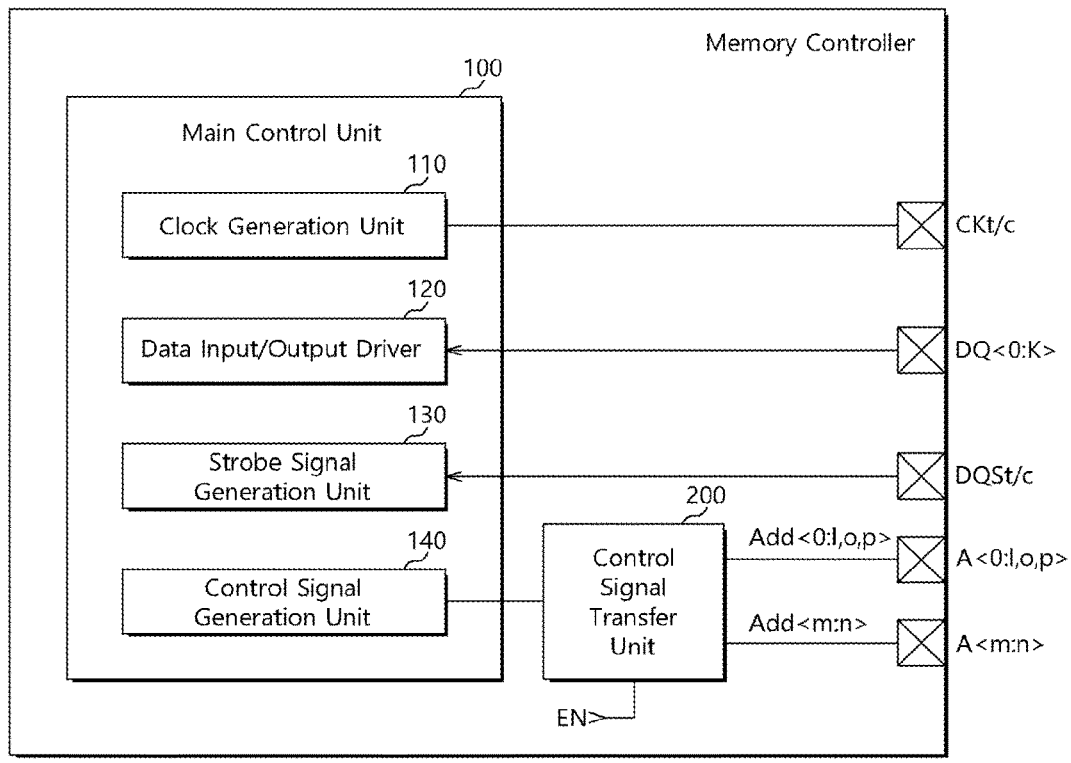
FIG. 1 illustrates a memory controller in accordance with an embodiment of the present disclosure.

FIG. 1 shows a memory controller 10 in accordance with an embodiment of the present disclosure. The memory controller 10 may include a digital circuit including hardware and/or software that manage the flow of digital data in and out of a main memory inside a computing device such as a desktop, a server, a workstation, etc. The memory controller 10 may be formed as a separate memory controller chip or integrated into another chip sharing a common die. The memory controller 10, in some instances, may be integrated into a microprocessor.

Referring to FIG. 1, a memory controller 10 in accordance with an embodiment of the present disclosure may include, inter alia, a main control unit 100 and a control signal transfer unit 200.

The main control unit 100 of the memory controller 10 may include, inter alia, a clock generation unit 110 for generating a clock signal among others, a data input/output driver 120 for generating a data signal among others, a strobe signal generation unit 130 for generating a strobe signal among others, and a control signal generation unit 140 for generating a control signal among others.

The clock generation unit 110 may be configured to generate a clock signal, which may be set with a preset speed and provide the generated clock signal to a clock pad CKt/c. It is noted that the clock signal may be generated as a complementary signal.

The data input/output driver 120 may be configured to amplify the data signal based on a preset bandwidth (e.g., k+1) that is transferred (i.e., inputted or outputted) through data input/output pads DQ<0:k> between the memory controller 10 and a memory (not shown in FIG. 1).

The strobe signal generation unit 130 generates a strobe signal that toggles in response to the data signal for indicating the actual transfer of data to the receiving end. The strobe signal, which may be a complementary signal, is provided to a strobe pad DQSt/c.

The control signal generation unit 140 may be configured to generate a control signal, which may include an address signal, for identifying a memory region to be accessed by the memory controller 10. In different embodiments of the present disclosure, the bit size of the address signal, which may be the control signal generated by the control signal generation unit 140, may differ depending on the type of the memory targeted for control. For example, as shown in FIG. 1, the control signal generation unit 140 may be configured to generate a control signal Add<0,p> including a first control signal Add<0:l,o,p> among Add<0:p> or a second control signal among Add<m:n> among Add<0:p> depending on the type of the memory. That is: Add<0:p>=Add<0:l,m:n,o,p>.

The control signal transfer unit 200 may be configured to receive the control signal Add<0:p> from the control signal generation unit 140 and apply the control signal Add<0:p> to at least some of control signal pads A<0:p> in response to an enable signal EN, the logic level of which is determined according to the type of the target memory to be controlled (not shown in FIG. 1). In an embodiment of the present disclosure, the control signal may include an address signal, and the control signal pads may include address pads.

In an embodiment of the present disclosure, the memory controller 10 may be configured to selectively control different types of memories such as, inter alia, a DDR4 (Double Data Rate 4) memory, an LPDDR4 (Low Power Double Data Rate 4) memory, etc. In an embodiment of the present disclosure, the different types of memories are referred to as a first-type memory and a second-type memory for following disclosure. For controlling a first-type memory, the enable signal EN may be set to one level (for example, deactivated), and similarly, the enable signal EN may be set to a different level (for example, activated) when controlling the second-type memory; however, it should be readily understood that other embodiments of the present disclosure are not limited thereto.

In an embodiment of the present disclosure, each of the first-type memory and the second-type memory may be configured as a single rank or multi-ranks. For example, a memory rank could refer to a set of memory devices (e.g., chips) connected to the same chip select so as to allow simultaneous access of the memory devices. In a typical memory (e.g., DRAM) configuration, for example, the data pins may be shared across the ranks along with other command and control signals, except the chip select pins, which are separate.

A rank may indicate a memory device (e.g., a chip) configured to have the same bandwidth as the memory controller 10. Further, a rank may be defined as a group of memory devices (for example, a group of chips) that are enabled and accessed together, that is, an operating unit of the memory devices.

In an embodiment of the present disclosure, each of the first-type and second-type memories may include one or more memory ranks. In particular, each of the memory ranks constituting the second-type memory may be configured as a DDP (Double Die Package) with two memory chips packaged therein.

When the enable signal EN is deactivated, for example, to control the first-type memory, the control signal generation unit 140 may generate a multi-bit first control signal, which may be a multi-bit first address signal Add<0:p>. The control signal transfer unit 200 may provide the multi-bit first address signal Add<0:p>, which more specifically is Add<0:l,m:n,o,p>, i.e., Add<0:p>=Add<0:l,m:n,o,p> to the respective address pads A<0:p>=A<0:l,m:n,o,p>. In the case of the memory controller 10 controlling the first-type memory according to an embodiment of the present disclosure, the first address signal Add<0:p> may be generated as a signal having the same number of bits as the number of the address pads A<0:p>. However, it should be readily understood that other embodiments are not limited thereto.

When the enable signal EN is, for example, activated to control a second-type memory according to an embodiment of the present disclosure, the control signal generation unit 140 may generate a multi-bit second control signal, which may be a multi-bit second address signal Add<0:l>. The control signal transfer unit 200 may provide the multi-bit second address signal Add<0:l> to a part of the control signal pads, for example, a first control signal pad group A<0:l>. Furthermore, the control signal transfer unit 200 may provide the second address signal Add<0:l> to a different part of the control signal pads, for example, a second control signal pad group A<m:n> independent of the first control signal pad group A<0:l>. In an embodiment of the present disclosure, when the memory controller 10 controls the second-type memory, the second address signal Add<0:l> may be generated as a signal having bits, the number of which equals or is less than a half of the number of the address pads A<0:p>, i.e., [(l+1)≤(p+1)/2]. However, it should be readily understood that other embodiments are not limited thereto.

In an embodiment of the present disclosure, the first-type memory may, for example, be a DDR4 (Double Data Rate 4) memory. In such a case, the first address signal Add<0:p> may be a 14-bit first address signal Add<0:13> that is provided to the respective fourteen address pads A<0: p>=A<0:13>.

In an embodiment of the present disclosure, the second-type memory may, for example, be an LPDDR4 (Low Power Double Data Rate 4) memory. In such a case, the second address signal Add<0:l> may be the six bit second address signal Add<0:l>=Add<0:5> that is provided to the respective six address pads A<0:l>=A<0:5> corresponding to the first control signal pad group and to the respective six address pads A<m:n>=A<6:11> corresponding to the second control signal pad group.

On the one hand, when the memory controller 10 is used to control a memory including a memory device configured as a DDP (Double Die Package)-type memory device, the second address signal Add<0:l> outputted from the first control signal pad group A<0:5> may be divided and provided to two dies within the memory device at the same time. In such a case, the address pads at the memory controller and the address pads at the memory are coupled at the ratio of 1:[2×rank number], which might not lead to the desired signal integrity.

In an embodiment of the present disclosure, however, when the second-type memory is configured as a DDP (Double Die Package)-type memory device, the control signal transfer unit 200 may provide the second address signal Add<0:l> to any one of the memory dies by applying the second address signal Add<0:l> to the first control signal pad group A<0:l>, and provide the second address signal Add<0:l> to the other memory die by applying the second address signal Add<0:l> to the second control signal pad group A<m:n> independent of the first control signal pad group A<0:l>, thereby minimizing the loads of the address lines and securing signal integrity. That is, because the address pads at the memory controller 10 and the address pads at the memory are coupled at a 1:1 ratio, the integrity of the address signal can be guaranteed.

In an embodiment of the present disclosure, the memory controller 10 may include both the main control unit 100 and the control signal transfer unit 200. Alternatively, it is also possible that the memory controller 10 may include the control signal transfer unit 200 coupled to the main control unit 100 through wiring outside the memory controller 10 according to an embodiment of the present disclosure.

Figure 2:
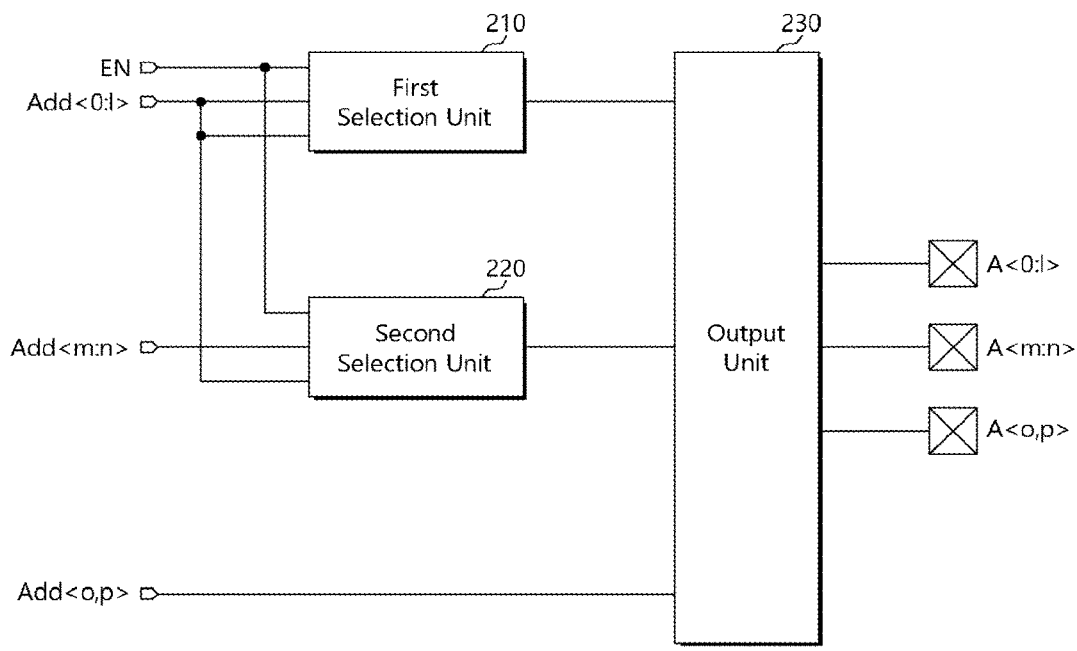
FIG. 2 illustrates a control signal transfer unit in accordance with an embodiment of the present disclosure.

FIG. 2 shows the control signal transfer unit 200 in accordance with an embodiment of the present disclosure.

Referring to FIG. 2, the control signal transfer unit 200 may include a first selection unit 210, a second selection unit 220, and an output unit 230.

The first selection unit 210 may be configured to receive the address signal Add<0:l> either as a part of the first address signal Add<0:p> or as the second address signal Add<0:l>. The first selection unit 210 may be configured to output the address signal Add<0:l> of the first address signal Add<0:p> or the second address signal Add<0:l> in response to the enable signal EN, which, for example, is activated or deactivated depending on the type of a control target memory.

The second selection unit 220 may be configured to receive the address signal Add<m:n> either as a part of the first address signal Add<0:p> or as the second address signal Add<0:l>. The second selection unit 220 may be configured to output the address signal Add<m:n> of the first address signal Add<0:p> or the second address signal Add<0:l> in response to the enable signal EN which, for example, is activated or deactivated depending on the type of the control target memory.

The output unit 230 may be configured to amplify the address signals Add<0:l> and Add<m:n> outputted from the first and second selection units 210 and 220 and the address signal Add<o,p>, and apply the amplified signals, that is, Add<0:p>=Add<0:l,m:n,o,p>, to the corresponding address pads A<0:p>.

In an embodiment of the present disclosure, when the first-type memory is controlled, the part Add<0:l> of the first address signal Add<0:p> outputted from the first selection unit 210, the another part Add<m:n> of the first address signal Add<0:p> outputted from the second selection unit 220, and the other part Add<o,p> of the first address signal Add<0:p> may be amplified and applied to the independent address pads A<0: p>, respectively.

When the second-type memory is controlled, the second address signal Add<0:l> outputted from the first selection unit 210 and the second address signal Add<0:l> outputted from the second selection unit 220 may be amplified and applied to the independent control signal pad groups A<0:l> and A<m:n>, respectively.

Figure 3A:
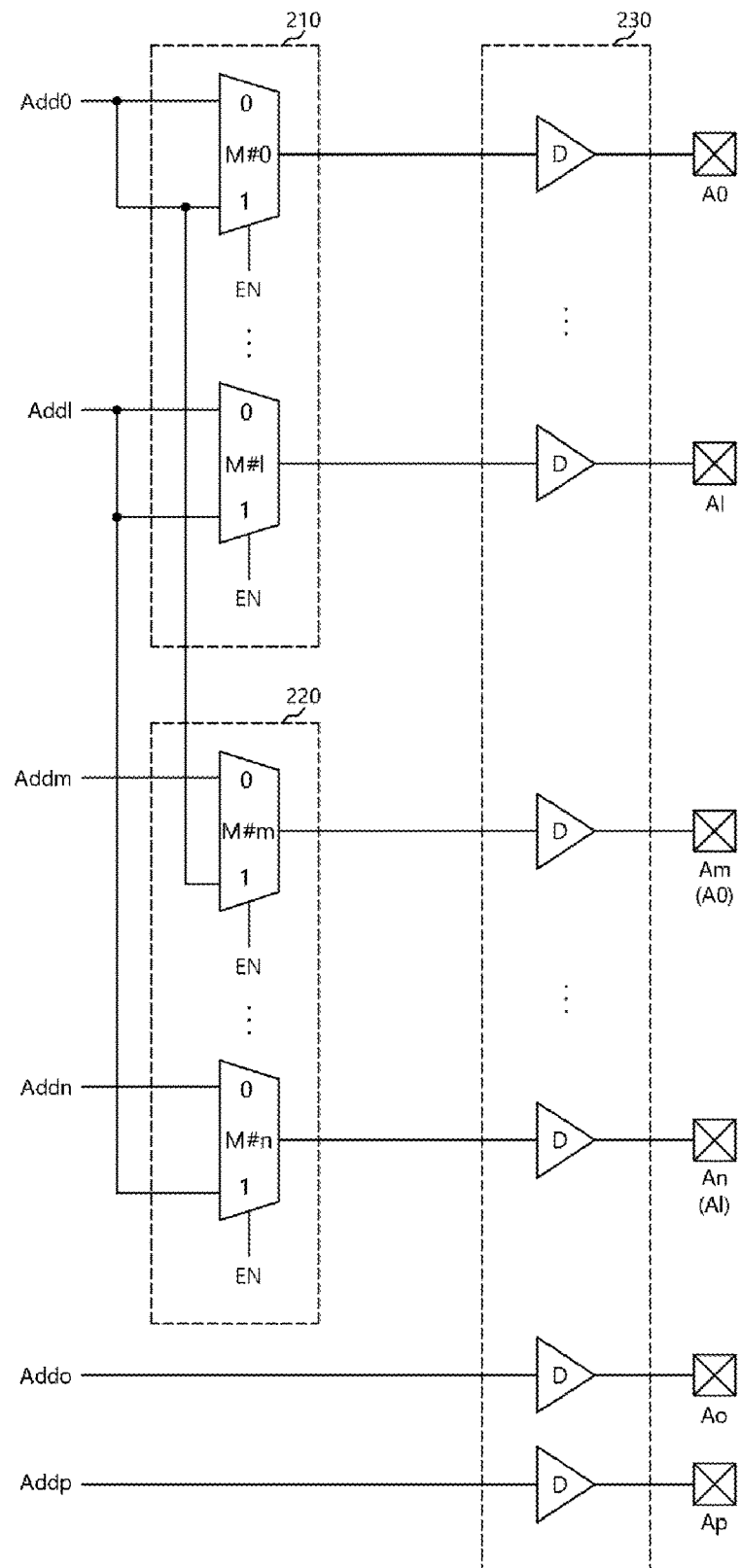
FIGS. 3A to 3C are circuit diagrams illustrating the control signal transfer unit in accordance with an embodiment of the present disclosure.
Figure 3B:
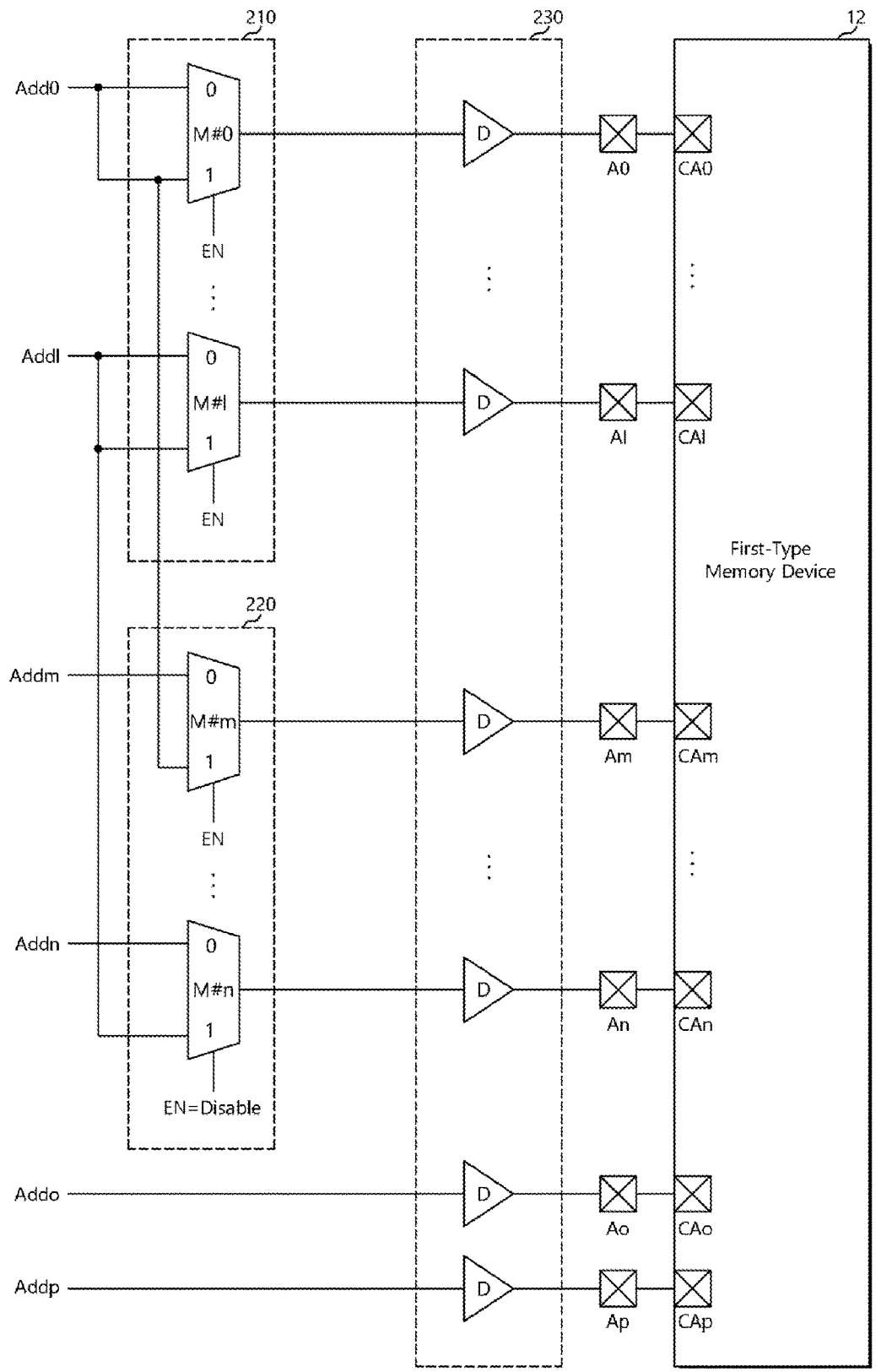
Figure 3C:
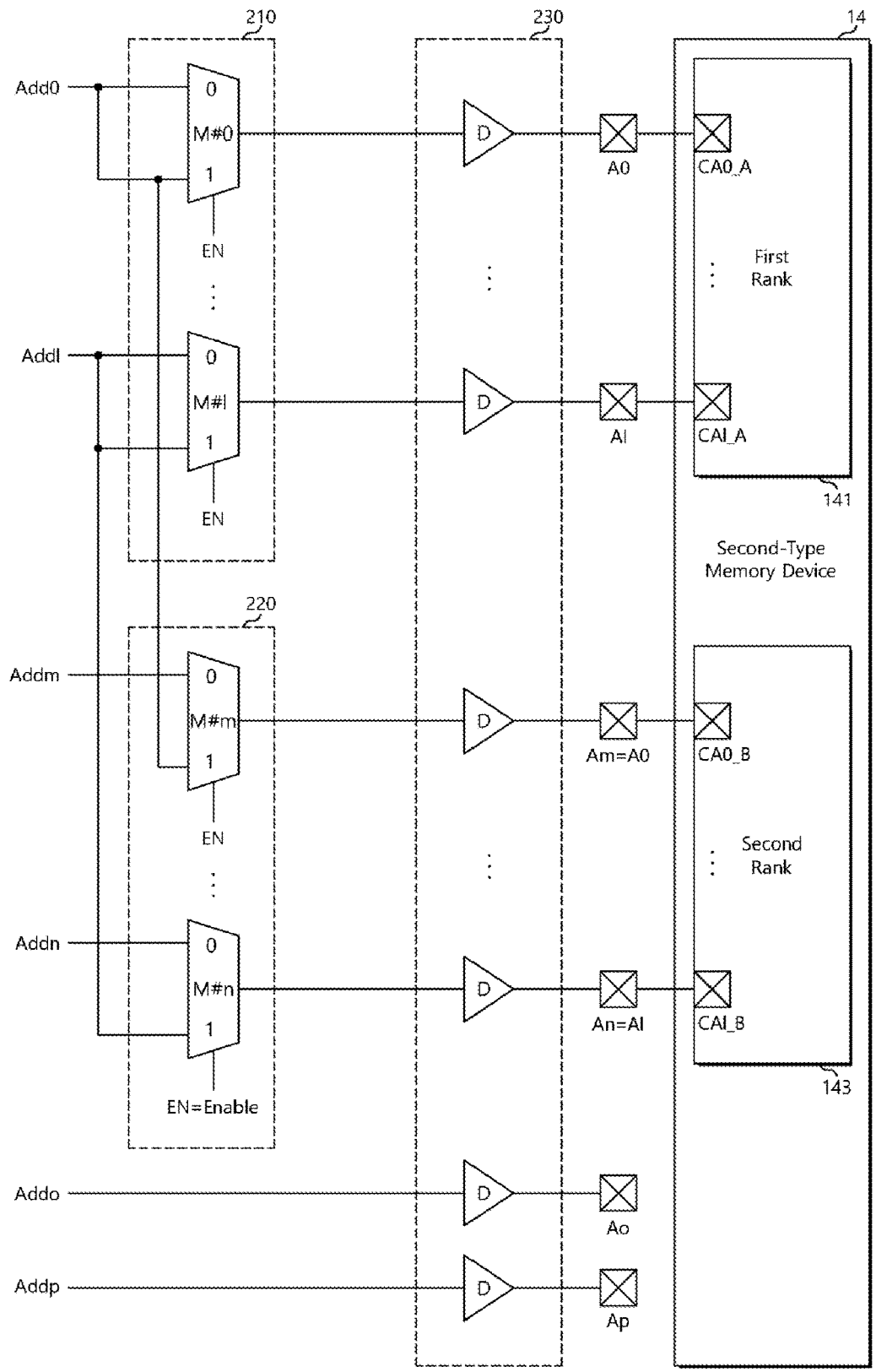

FIGS. 3A to 3C are circuit diagrams illustrating the control signal transfer unit 200 in accordance with an embodiment of the present disclosure.

Referring to FIG. 3A, the first selection unit 210 may include selection circuits M #0 to M #l which are configured to receive the respective bits of the part Add<0:l> of the first address signal Add<0:p> or the respective bits of the second address signal Add<0:l> as a first or second input signal, and output the first or second signal in response to the enable signal EN.

The second selection unit 220 may include selection circuits M #m to M #n which are configured to receive the respective bits of the another part Add<m:n> of the first address signal Add<0:p> as the first input signal, receive the respective bits of the second address signal Add<0:l> as the second input signal, and output the first or second input signal in response to the enable signal EN.

The output unit 230 may include a plurality of amplifier circuits D configured to amplify the output signals of the selection circuits M #0 to M #n and the address signal Add<o,p>, respectively, and apply the amplified signals to the address pads A<0:p>. In an embodiment of the present disclosure, the address signal Add<o,p>, for example, may be inputted only when the enable signal EN is deactivated or the first-type memory device is controlled. However, it should be readily understood that scope of other embodiments are not limited thereto.

Now referring to FIG. 3B, the case that the first-type memory device 12 is controlled by the memory controller 10 including the control signal transfer unit 200 shown in FIG. 3A is described.

Referring to FIG. 3B, the enable signal EN of which the logic level is decided according to the type of the control target memory may be deactivated, for example, when the first-type memory device 12 is controlled.

Thus, the part Add<0:l> of the first address signal Add<0:p> may be outputted from the first selection unit 210, and the another part Add<m:n> of the first address signal Add<0:p> may be outputted from the second selection unit 220. Furthermore, the output unit 230 may amplify the part Add<0:l> of the first address signal Add<0:p>, the another part Add<m:n> of the first address signal Add<0:p> and the other part Add<o,p> of the first address signal Add<0:p>, and apply the amplified signals to the respective address pads A<0:p>.

The address signal which is applied as the control signal to the address pads A<0:p> of the controller 10 may be applied to the respective address pads CA<0:l,m:n,o,p> of the first-type memory device 12.

The case that the second-type memory device 14 is controlled by the controller 10 including the control signal transfer unit 200 illustrated in FIG. 3A is described with reference to FIG. 3C.

Referring to FIG. 3C, the enable signal EN of which the logic level is decided according to the type of the control target memory may, for example, be activated when the second-type memory device 14 is controlled.

Thus, the second address signal Add<0:l> may be outputted from both of the first selection unit 210 and the second selection unit 220.

The output unit 230 may amplify the second address signal Add<0:l> provided from the first selection unit 210 and apply the amplified signal to the first control signal pad group A<0:l>, and amplify the second address signal Add<0:l> provided from the second selection unit 220 and apply the amplified signal to the second control signal pad group A<m:n>=A<0:l>.

The second-type memory device 14 may include first and second ranks 141 and 143.

The second address signal Add<0:l> which is applied as the control signal to the first control signal pad group A<0:l> of the controller 10 may be applied to the respective address pads CA<0:l>_A of the first rank 141. Furthermore, the second address signal Add<0:l> which is applied as the control signal to the second control signal pad group A<m:n>=A<0:l> of the controller 10 may be applied to the respective address pads CA<0:l>_B of the second rank 143.

Figure 4A:
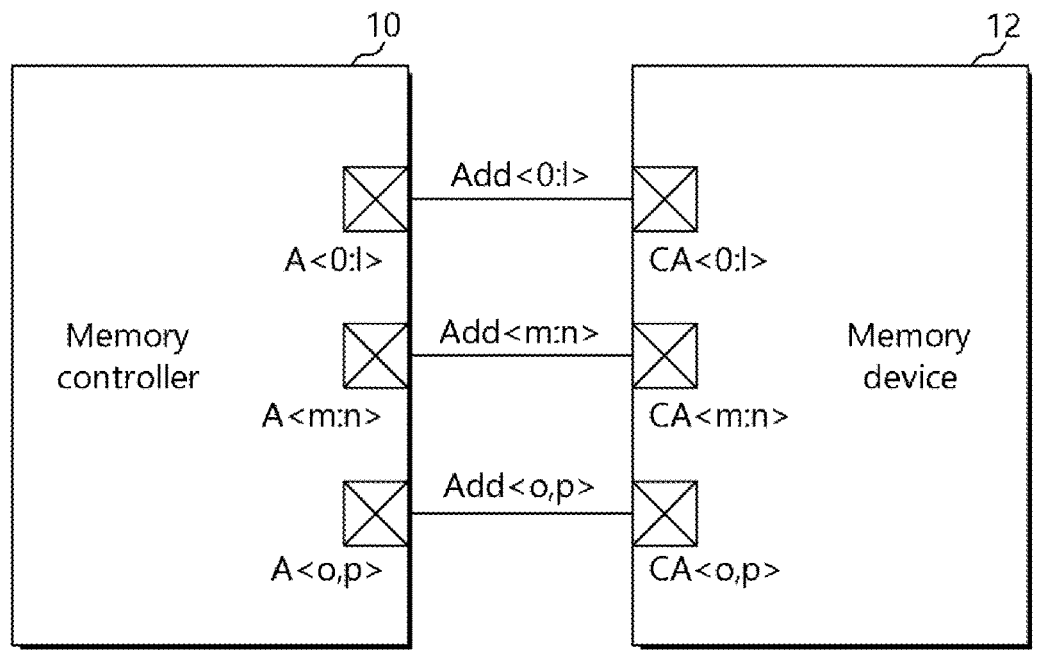
FIGS. 4A and 4B illustrate memory systems in accordance with various embodiments of the present disclosure.
Figure 4B:
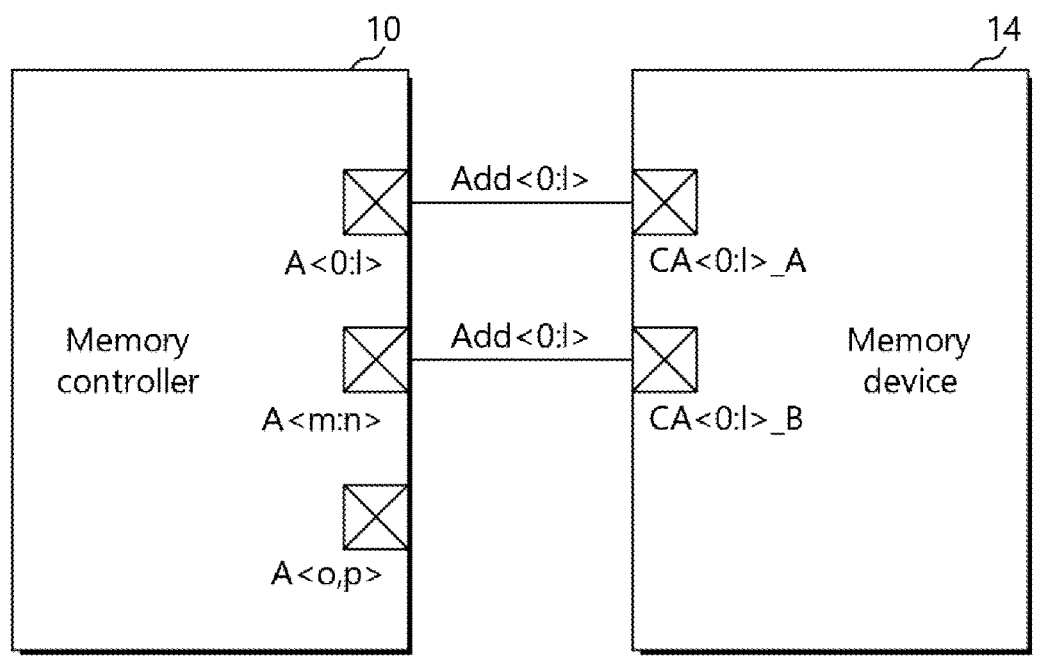

FIGS. 4A and 4B are configuration diagrams illustrating memory systems in accordance various embodiments of the present disclosure.

Referring to FIG. 4A, the memory system 50 may include the memory controller 10 and the first-type memory device 12.

In an embodiment of the present disclosure, the first-type memory device 12 may include one or more memory ranks having a designated bandwidth. In an embodiment of the present disclosure, the bandwidth may be set to X8 or X16, but other embodiments are not limited thereto. Furthermore, the number of memory chips constituting one memory rank may be set to 1, 2, or 4, but other embodiments are not limited thereto.

When the memory controller 10 controls the first-type memory device 12 according to an embodiment of the present disclosure, the enable signal EN may, for example, be deactivated, and the control signal generation unit 140 may generate the first address signal Add<0:p>.

Referring to FIGS. 3A-3C and 4A, the first selection unit 210 may output the first input signal, i.e. the part Add<0:l> of the first address signal Add<0:p>, and the second selection unit 220 may output the first input signal, i.e. the another part Add<m:n> of the first address signal Add<0:p>. The output unit 230 may amplify the output signal Add<0:l> from the first selection unit 210, the output signal Add<m:n> from the second selection unit 220, and the other part Add<o,p> of the first address signal Add<0:p>, and apply the amplified signal as the first address signal Add<0:p> to the respective address pads A<0:l,m:n,o,p>. The first address signal Add<0:p> applied to the address pads A<0:l,m:n,o,p> may be applied to the address pads CA<0:l,m:n,o,p> of the first-type memory device 12.

Referring to FIG. 4B, the memory system 50-1 may include the memory controller 10 and the second-type memory device 14.

In an embodiment of the present disclosure, the second-type memory device 14 may include one or more memory ranks having a designated bandwidth and configured as a DDP (double die package). In an embodiment, the bandwidth may be set to X16 or X32, but other embodiments are not limited thereto. Furthermore, the number of memory chips constituting one memory rank may be set to 1, 2, or 4, but other embodiments are not limited thereto.

When the memory controller 10 controls the second-type memory device 14, the enable signal EN may, for example, be activated, and the control signal generation unit 140 may generate the second address signal Add<0:1>.

Referring to FIGS. 3A to 3C and 4B, the first selection unit 210 may output the second input signal, i.e. the second address signal Add<0:l>, and the second selection unit 220 may output the second input signal, i.e. the second address signal Add<0:l>. The output unit 230 may amplify the second address signal Add<0:l> provided from the first selection unit 210 and apply the amplified signal to the first control signal pad group A<0:l>, and amplify the second address signal Add<0:l> provided from the second selection unit 220 and apply the amplified signal to the second control signal pad group A<m:n>.

The second address signal Add<0:l> applied to the first address pad group A<0:l> may be applied to address pads CA<0:l>_A installed in a first die constituting the second-type memory device 14, and the second address signal Add<0:l> applied to the second control signal pad group A<m:n> may be applied to address pads CA<0:l>_B installed in a second die constituting the second-type memory device 14.

The address pads CA<0:l>_A and CA<0:l>_B of the dies constituting the memory device 14 which is implemented as a DDP (Double Die Package)-type memory device may be coupled one-to-one to those of the memory controller 10, and receive the control signal, which makes it possible to minimize the loads of the control signal transfer lines while securing signal integrity.

FIGS. 5A to 5E are configuration diagrams illustrating memory devices in accordance with various embodiments of the present disclosure.

Figure 5A:
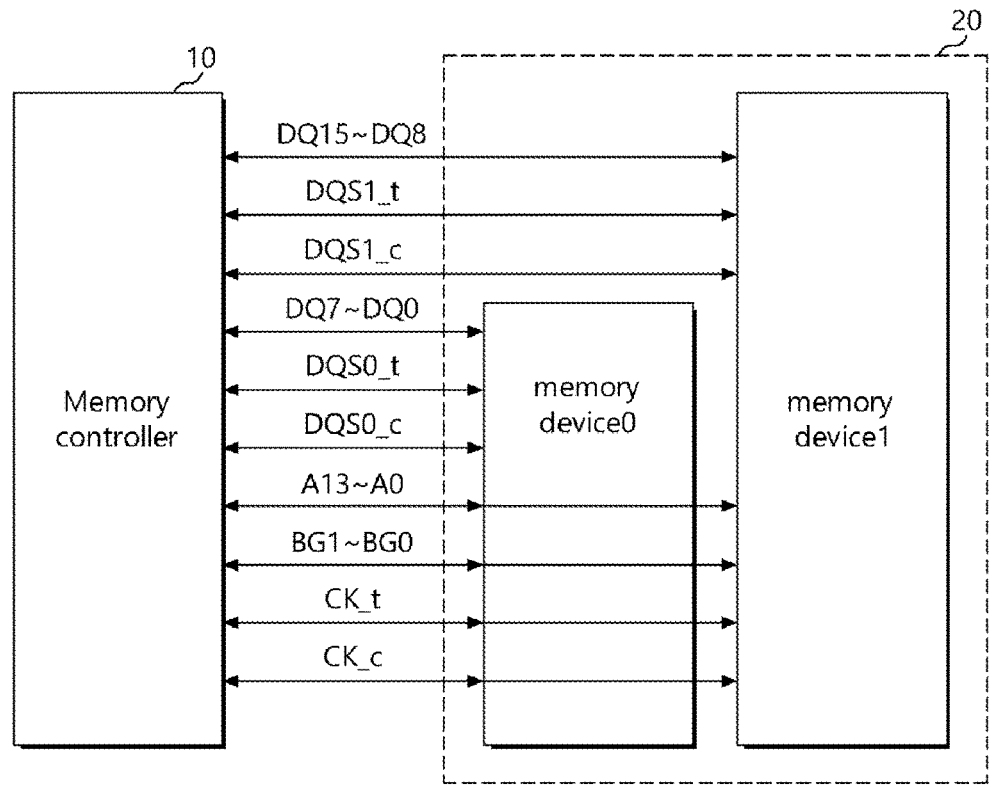
Figure 5B:
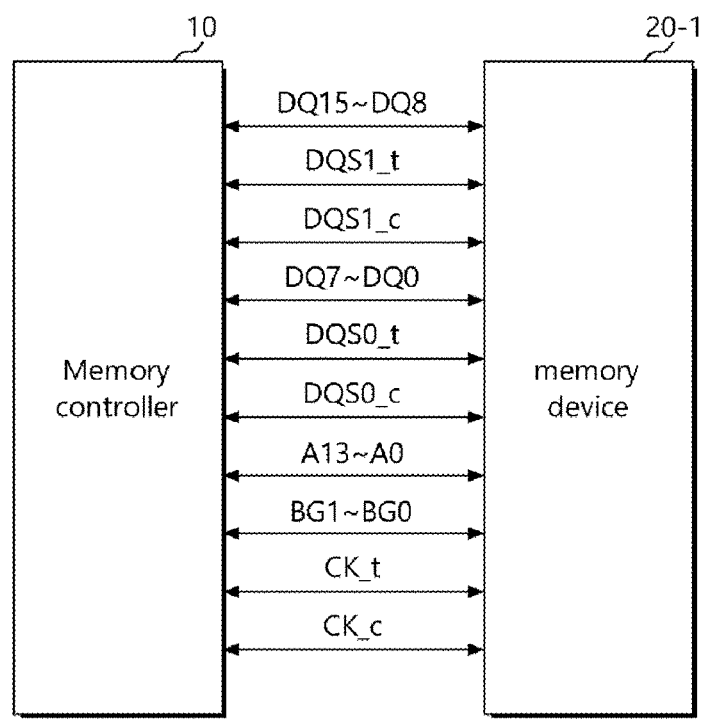

FIGS. 5A and 5B illustrate a memory controller 10 having a bandwidth of X16 and memories 20 and 20-1 controlled by the memory controller 10.

In the memory 20 of FIG. 5A according to an embodiment of the present disclosure, two memory devices having a bandwidth of X8 may constitute one rank. In the memory 20-1 of FIG. 5B, one memory device having a bandwidth of X16 may constitute one rank to communicate with the memory controller 10.

Figure 5C:
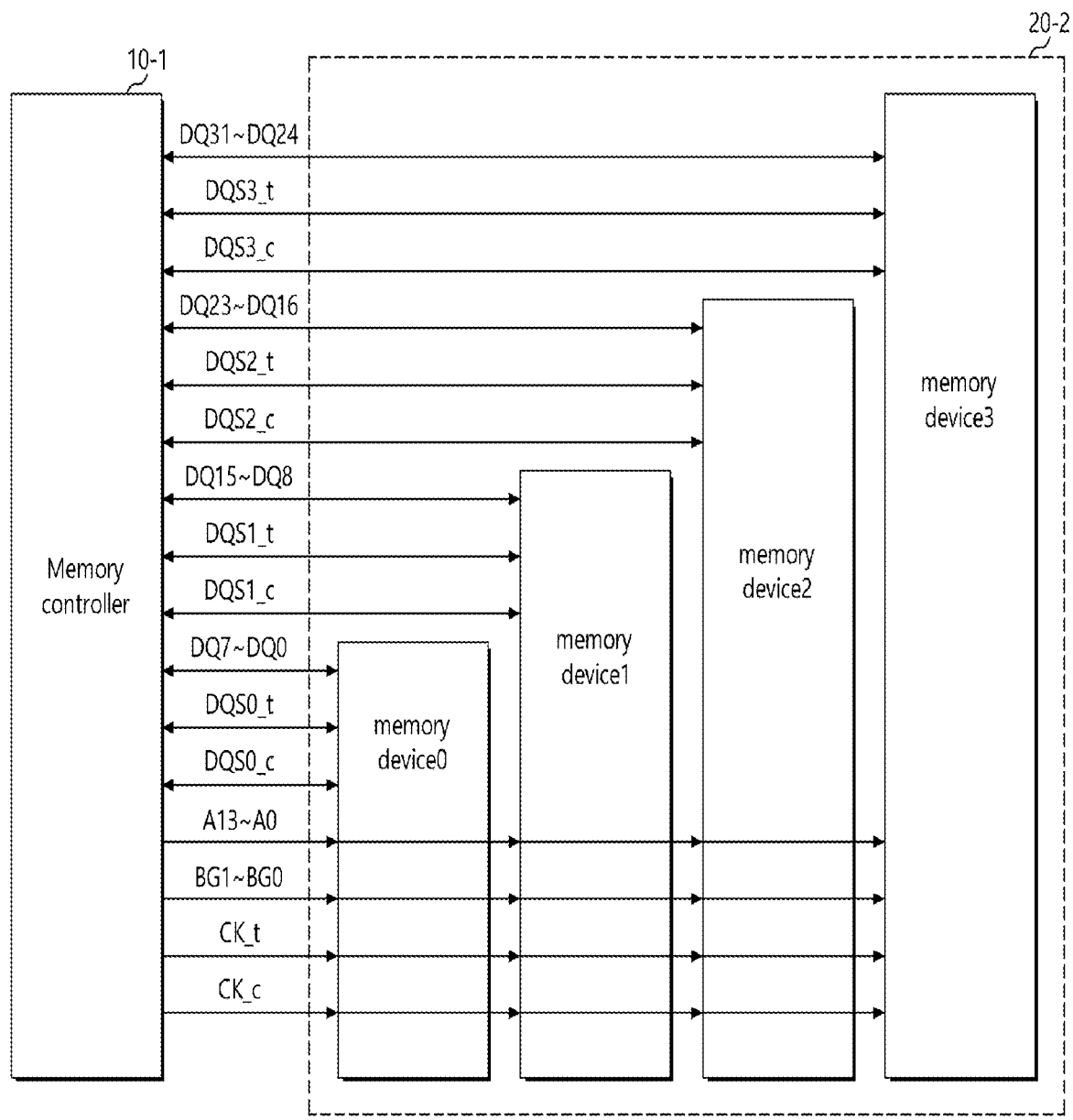
Figure 5D:
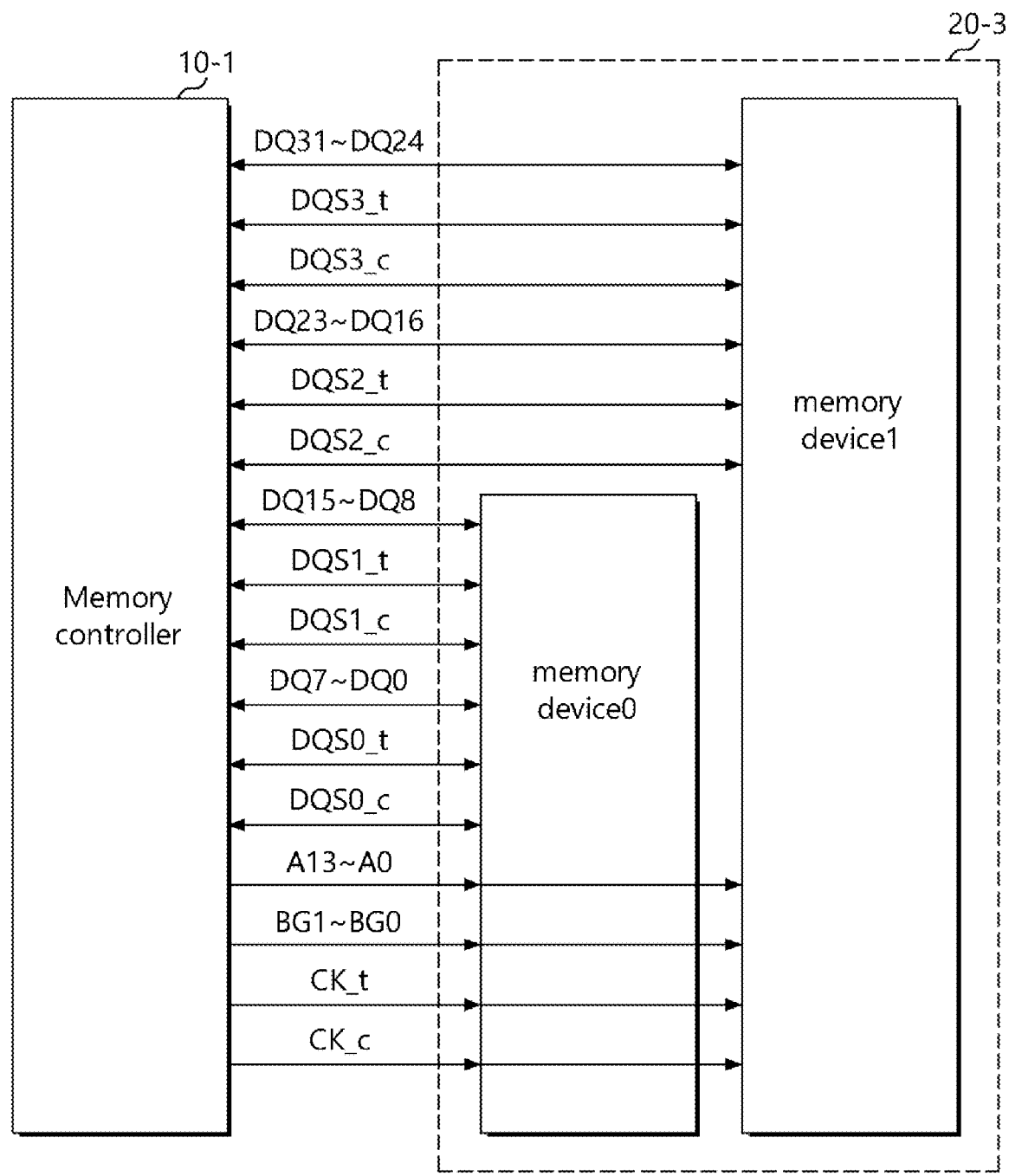

FIGS. 5C to 5E illustrate a memory controller 10-1 having a bandwidth of X32 and memories 20-2, 20-3, and 20-4/20-5, respectively, controlled by the memory controller 10-1.

FIG. 5C illustrates that the memory 20-2 includes four memory devices having a bandwidth of X8 and constituting one rank. FIG. 5D illustrates that the memory 20-3 includes two memory devices having a bandwidth of X16 and constituting one rank 20-3.

The memories 20-4 and 20-5 of FIG. 5E include two ranks. Each of the ranks may include four memory devices having a bandwidth of X8.

The memory devices illustrated in FIGS. 5A to 5E may be first-type memories controlled by the memory controller 10 or 10-1.

Figure 6A:
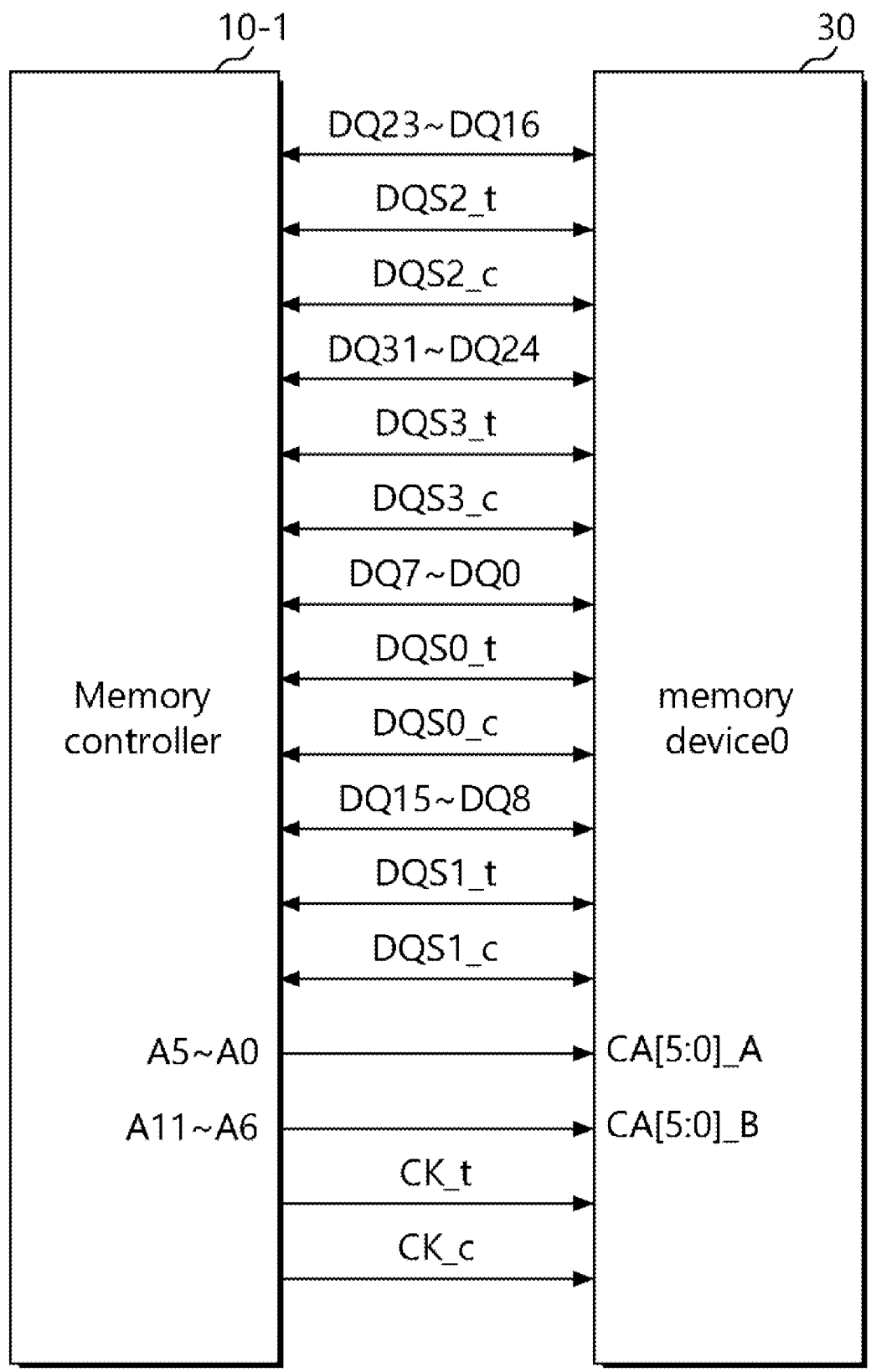
FIGS. 6A and 6B illustrate memory devices in accordance with various embodiments of the present disclosure.
Figure 6B:
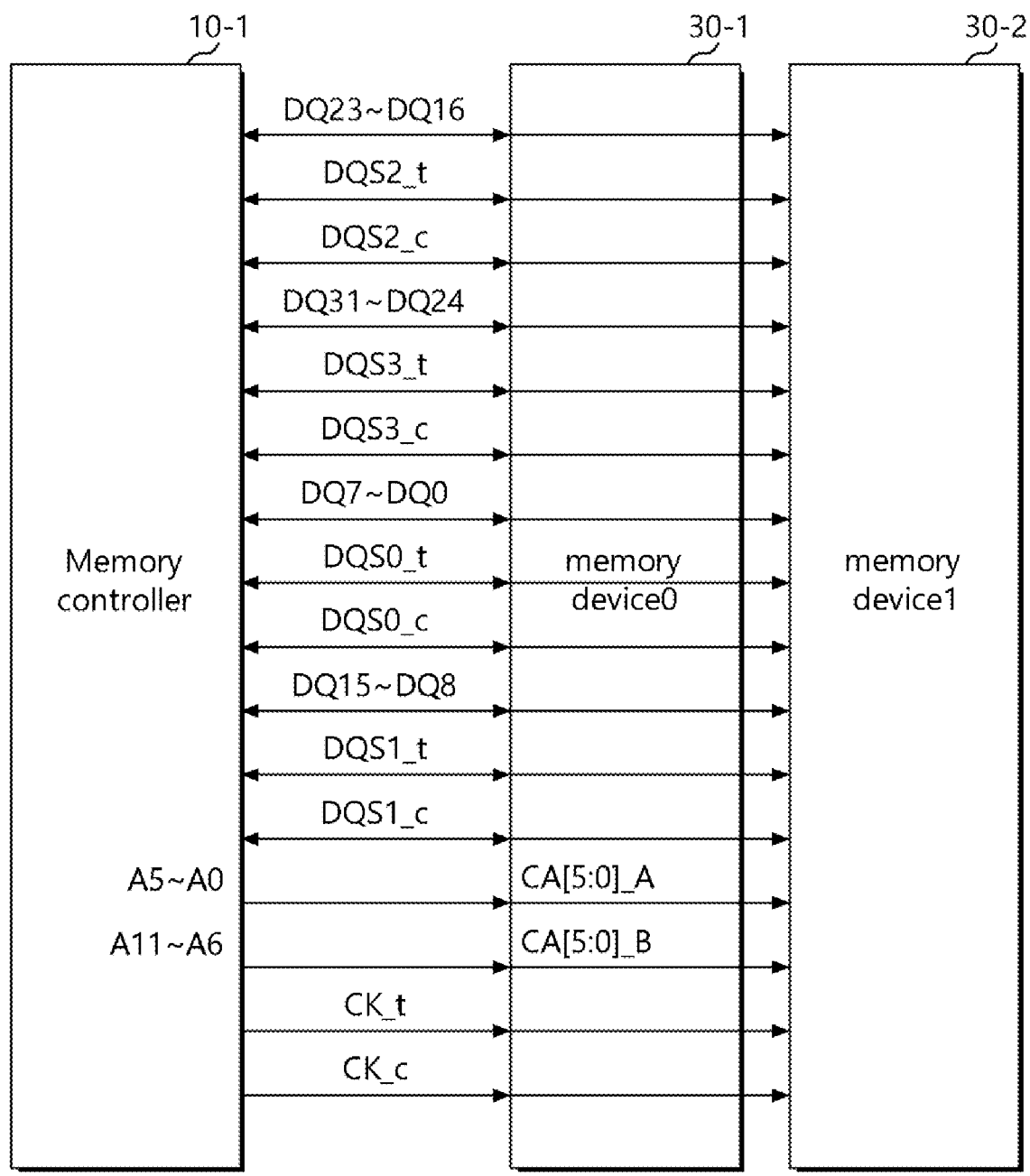

FIGS. 6A and 6B are configuration diagrams illustrating to memory devices in accordance with embodiments.

FIGS. 6A and 6B illustrate a memory controller 10 having a bandwidth of X32 and memories 30 and 30-1 controlled by the memory controller 10.

In the memory 30 of FIG. 6A, one memory device having a bandwidth of X32 and implemented as a DDP-type memory device may constitute one rank.

The memory 30-1 of FIG. 6B may include two ranks. Each of the ranks may include one memory device having a bandwidth of X32 and implemented as a DDP-type memory device.

When the memories 30 and 30-1 implemented as DDP-type memory devices are controlled as illustrated in FIGS. 6A and 6B, the control signal transfer unit 200 may apply the second address signal Add<0:5> to the first control signal pad group A<0:5>, and apply the second address signal Add<0:5> to the second control signal pad group A<6:11> independent of the first control signal pad group A<0:5>, thereby minimizing the loads of the address lines and securing signal integrity.

Figure 7:
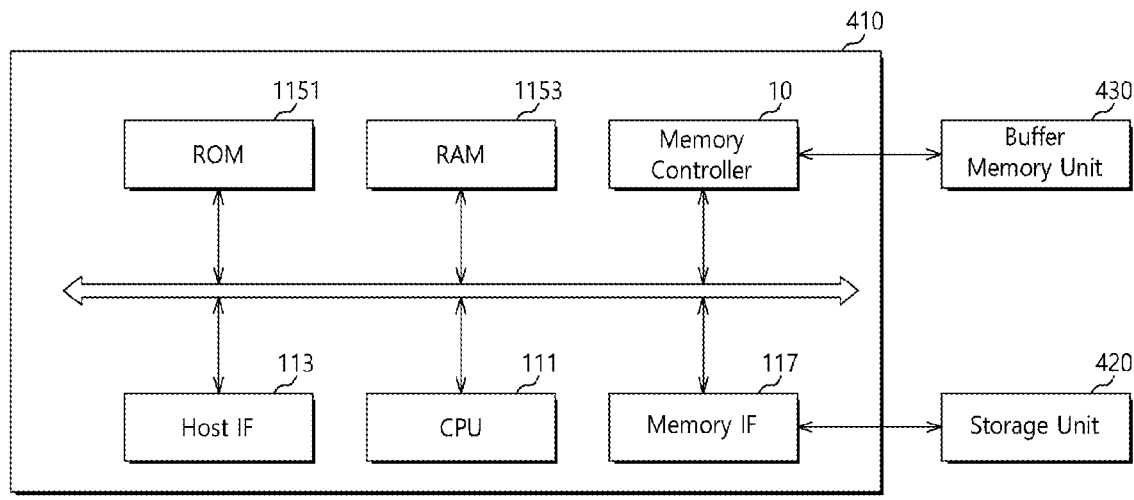
FIG. 7 illustrates a data storage device in accordance with an embodiment of the present disclosure.

FIG. 7 is a configuration diagram illustrating a data storage device in accordance with an embodiment of the present disclosure.

Referring to FIG. 7, the data storage device 40 in accordance with an embodiment of the present disclosure may include a controller 410, a storage unit 420, and a buffer memory unit 430.

The controller 410 may control the storage unit 420 in response to a request from a host device. For example, the controller 410 may program data to the storage unit 420 according to a program (write) request of a host device. Also, the controller 410 may provide data stored in the storage unit 420 to a host device in response to a read request of the host device.

The storage unit 420 may write data thereto or output data written therein under control of the controller 410. The storage unit 420 may be configured as a volatile or nonvolatile memory device. In an embodiment of the present disclosure, the storage unit 420 may be implemented as a memory device selected from various nonvolatile memory devices such as an EEPROM (Electrically Erasable and Programmable ROM), NAND flash memory, NOR flash memory, PRAM (Phase-Change RAM), ReRAM (Resistive RAM), FRAM (Ferroelectric RAM), and STT-MRAM (Spin Torque Transfer Magnetic RAM), among others. The storage unit 420 may have a hierarchical structure composed of, for example, a page including a plurality of memory cells, a block including one or more pages, a plane including one or more blocks, and a die including one or more planes. The read/write (program) operation may be performed on a page basis, for example, and the erase operation may be performed on a block basis. In order to improve the data input/output speed, the processing unit of read or written data may be decided according to the fabrication purpose of the data storage device 40. Furthermore, the storage unit 420 may include single-level cells each configured to store one-bit data therein or multi-level cells each configured to store multi-bit data therein.

The buffer memory unit 430 may serve as a space in which data can be temporarily stored when the data storage device 40 inputs/outputs the data while interworking with the host device.

In an embodiment of the present disclosure, the buffer memory unit 430 may be selected from the memories 20, 20-1, 20-2, 20-3, 20-4/20-5, 30 and 30-1 which are illustrated in FIGS. 5A to 5E or FIGS. 6A and 6B.

The controller 410 may include a central processing unit (CPU) 111, a host interface 113, a ROM 1151, a RAM 1153, a memory interface 117, and a memory controller 10.

The CPU 111 may be configured to transfer various pieces of control information to the host interface 113, the RAM 1153 and the memory interface 117, the various pieces of control information being required for reading or writing data from or to the storage unit 420. In an embodiment of the present disclosure, the CPU 111 may operate according to firmware provided for various operations of the data storage device 40. In an embodiment, the CPU 111 may perform a function of a flash translation layer (FTL) for performing garbage collection, address mapping or wear leveling to manage the storage unit 420 or a function of detecting and correcting an error of data read from the storage unit 420.

The host interface 113 may provide a communication channel for receiving a command and clock signal from the host device and controlling data input/output, under control of the CPU 111. In particular, the host interface 113 may provide a physical connection between the host device and the data storage device 40. Furthermore, the host interface 113 may provide an interface with the data storage device 40 in response to the bus format of the host device. The bus format of the host device may include one or more of standard interface protocols such as secure digital, USB (Universal Serial Bus), MMC (Multi-Media Card), eMMC (Embedded MMC), PCMCIA (Personal Computer Memory Card International Association), PATA (Parallel Advanced Technology Attachment), SATA (Serial Advanced Technology Attachment), SCSI (Small Computer System Interface), SAS (Serial Attached SCSI), PCI (Peripheral Component Interconnection), PCI-E (PCI Express), and UFS (Universal Flash Storage).

The ROM 1151 may store program codes required for an operation of the controller 410, for example, firmware or software. Furthermore, the ROM 1151 may store code data used by the program codes.

The RAM 1153 may store program codes and data read from the ROM 1151. The RAM 1153 may store data required for an operation of the controller 410 or data generated by the controller 410.

The memory interface 117 may provide a communication channel for transmitting/receiving signals between the controller 410 and the storage unit 120. The memory interface 117 may write data to the storage unit 420 under control of the CPU 111, the data being to temporarily stored in the buffer memory unit. Furthermore, the memory interface 117 may transfer data read from the storage unit 420 to the buffer memory unit to temporarily store the data.

The memory controller 10 may be configured to control data input/output for the buffer memory unit 430. In this embodiment, the memory controller 10 may include the memory controller 10 illustrated in FIGS. 1 to 3.

Figure 8:
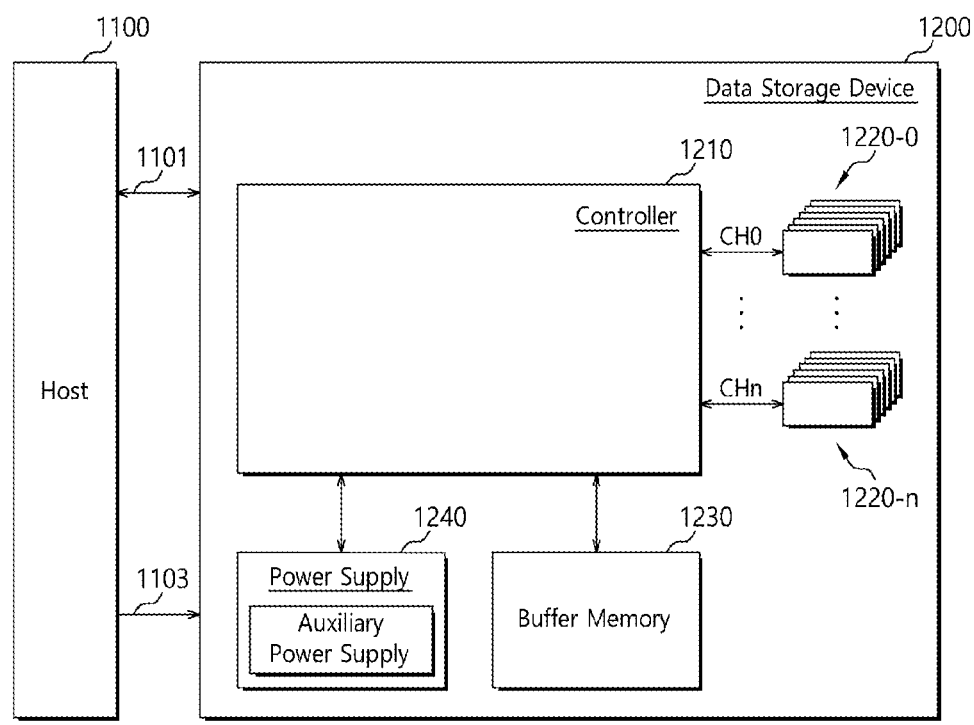
FIG. 8 illustrates a data storage system in accordance with an embodiment of the present disclosure.

FIG. 8 is a diagram illustrating a data storage system 1000 in accordance with an embodiment of the present disclosure.

Referring to FIG. 8, the data storage system 1000 may include a host device 1100 and the data storage device 1200. In an embodiment, the data storage device 1200 may be configured to a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103, among others.

The controller 1210 may control general operations of the data storage device 1200. The controller 1210 may include, inter alia, a host interface unit, a control unit, a random access memory used as a working memory, an error correction code (ECC) unit, and a memory interface unit (although these are not specifically not shown on FIG. 8). In an embodiment of the present disclosure, the controller 1210 may be configured by controller 110 as shown in FIGS. 1 to 3.

The host device 1100 may exchange a signal with the data storage device 1200 through the signal connector 1101. The signal may include a command, an address, data, etc.

The controller 1210 may analyze and process the signal received from the host device 1100. The controller 1210 may control operations of internal function blocks according to a firmware or a software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103, to the inside of the data storage device 1200. The power supply 1240 may include an auxiliary power supply. The auxiliary power supply may supply power to allow the data storage device 1200 to be normally terminated when a sudden power-off occurs. The auxiliary power supply may include large capacity capacitors.

The signal connector 1101 may be configured by various types of connectors depending on an interface scheme between the host device 1100 and the data storage device 1200.

The power connector 1103 may be configured by various types of connectors depending on a power supply scheme of the host device 1100.

Figure 9:
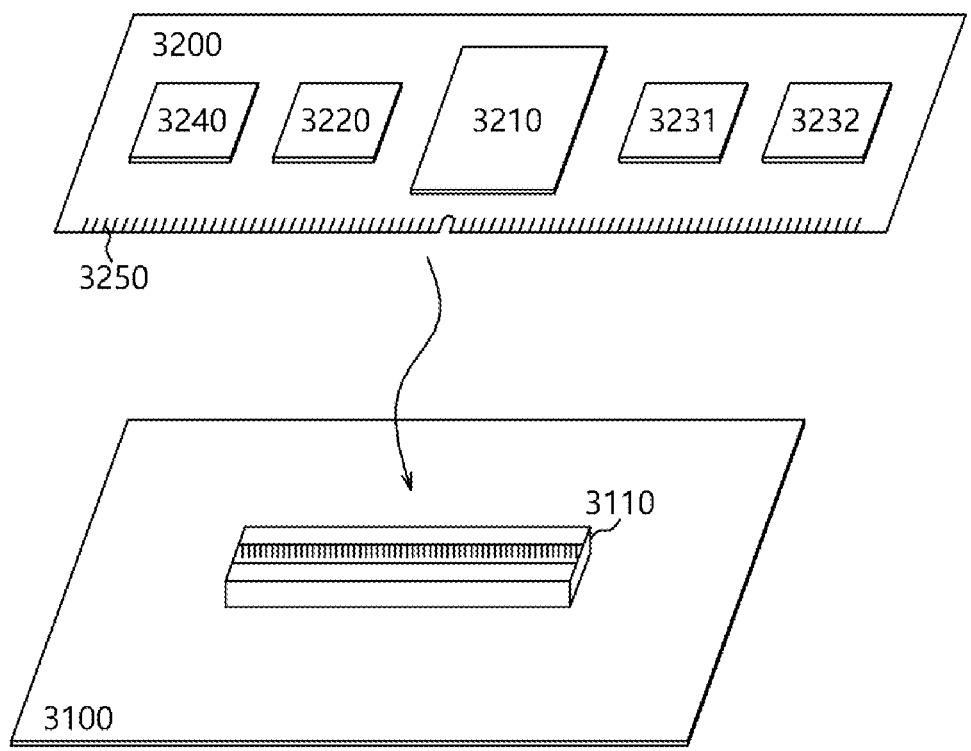
FIG. 9 and FIG. 10 illustrate a data processing system in accordance with an embodiment of the present disclosure.

FIG. 9 is a diagram illustrating a data processing system in accordance with an embodiment. Referring to FIG. 9, the data processing system 3000 may include a host device 3100 and the memory system 3200.

The host device 3100 may be configured in the form of a board such as a printed circuit board. Although not shown, the host device 3100 may include internal function blocks for performing the function of a host device.

The host device 3100 may include a connection terminal 3110 such as a socket, a slot or a connector. The memory system 3200 may be mounted to the connection terminal 3110.

The memory system 3200 may be configured in the form of a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 as shown in FIGS. 1 to 3.

The buffer memory device 3220 may temporarily store data to be stored in the nonvolatile memory devices 3231 and 3232. Further, the buffer memory device 3220 may temporarily store the data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250, to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data and so forth and power may be transferred between the host device 3100 and the memory system 3200. The connection terminal 3250 may be configured into various types depending on an interface scheme between the host device 3100 and the memory system 3200. The connection terminal 3250 may be disposed on any one side of the memory system 3200.

Figure 10:
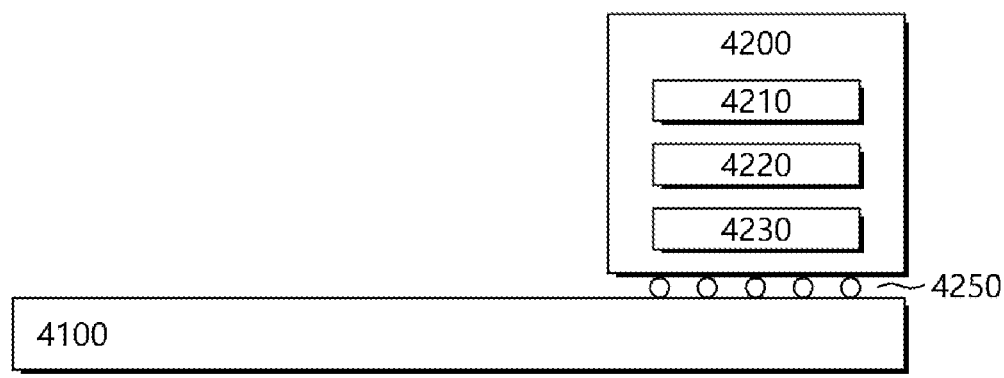

FIG. 10 is a diagram illustrating a data processing system in accordance with an embodiment. Referring to FIG. 10, the data processing system 4000 may include a host device 4100 and the memory system 4200.

The host device 4100 may be configured in the form of a board such as a printed circuit board. Although not shown, the host device 4100 may include internal function blocks for performing the function of a host device.

The memory system 4200 may be configured in the form of a surface-mounting type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 as shown in FIGS. 1 to 3.

The buffer memory device 4220 may temporarily store data to be stored in the nonvolatile memory device 4230.

Further, the buffer memory device 4220 may temporarily store the data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 11:
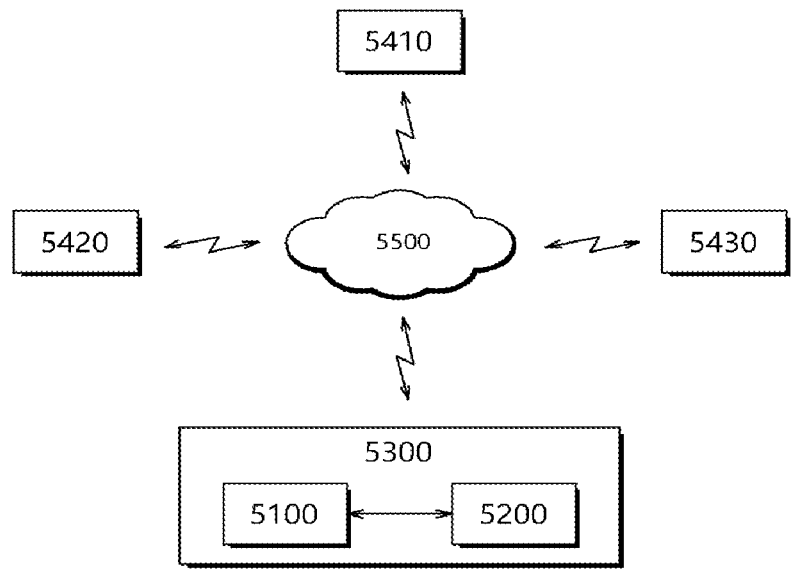
FIG. 11 illustrates a network system including a data storage device in accordance with an embodiment of the present disclosure.

FIG. 11 is a diagram illustrating a network system including a data storage device in accordance with an embodiment. Referring to FIG. 11, the network system 5000 may include a server system 5300 and a plurality of client systems 5410 to 5430 which are coupled through a network 5500.

The server system 5300 may service data in response to requests from the plurality of client systems 5410 to 5430. For example, the server system 5300 may store the data provided from the plurality of client systems 5410 to 5430. For another example, the server system 5300 may provide data to the plurality of client systems 5410 to 5430.

The server system 5300 may include a host device 5100 and the memory system 5200. The memory system 5200 may be configured by the memory system 10 shown in FIG. 1, the data storage device 1200 shown in FIG. 8, the memory system 3200 shown in FIG. 9 or the memory system 4200 shown in FIG. 10.

Figure 12:
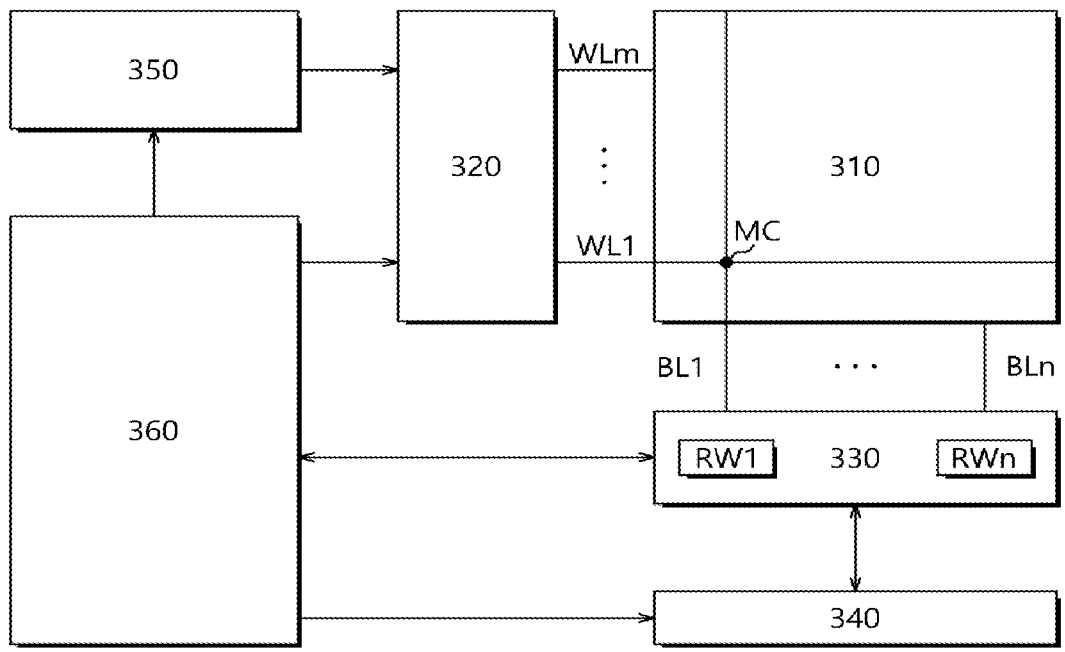
FIG. 12 illustrates a nonvolatile memory device included in a data storage device in accordance with an embodiment of the present disclosure.

FIG. 12 is a block diagram illustrating a nonvolatile memory device included in a data storage device in accordance with an embodiment. Referring to FIG. 12, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may include a three-dimensional memory array. The three-dimensional memory array has a direction perpendicular to the flat surface of a semiconductor substrate. Moreover, the three-dimensional memory array means a structure including NAND strings which at least memory cell is located in a vertical upper portion of the other memory cell.

The structure of the three-dimensional memory array is not limited thereto. It is apparent that the memory array structure can be selectively applied to a memory array structure formed in a highly integrated manner with horizontal directionality as well as vertical directionality.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device, the operating method thereof and the storage system including the same described herein should not be limited based on the described embodiments.

While various embodiments have been described above, it will be understood to those skilled in the art that the embodiments described are examples only. Accordingly, the operating method of a data storage device described herein should not be limited based on the described embodiments.

What is claimed is:

1. A memory controller configured to comprise a plurality of control signal pads, operably connectable to different type memories including a first-type memory and a second-type memory via the plurality of control signal pads, and to selectively control one of the first-type memory and the second-type memory, the memory controller comprising:
   a control signal generation unit configured to generate a control signal comprising a first control signal and a second control signal; and
   a control signal transfer unit configured to transmit directly at least one of the first control signal and the second control signal to one memory selected among the first-type memory and the second-type memory,
   wherein the plurality of control signal pads are divided into a first control signal pad group and a second control signal pad group, and
   the first-type memory is configured to be controlled by
      applying bits of the first control signal to the first control signal pad group, and
      applying bits of the second control signal to the second control signal pad group, and
   the second-type memory is be controlled by
      applying bits of the second control signal to the first control signal pad group, and applying the second control signal to the second control signal pad group independently of the first control signal pad group.

2. The memory controller according to claim 1,
wherein the first-type memory comprises a DDR4 (double data rate 4) memory; and
wherein the second-type memory comprises a LPDDR4 (low power double data rate 4) memory.

3. The memory controller of claim 1 further comprising:
a clock generation unit configured to generate a clock signal;
a data input/output driver configured to generate a data signal; and
a strobe signal generation unit configured to generate a strobe signal.

4. The memory controller according to claim 1, wherein the control signal transfer unit is configured to selectively control one of the first-type memory and the second-type memory in response to an enable signal.

5. The memory controller according to claim 1, wherein each of the first-type memory and the second-type memory comprises one or more memory devices.

6. The memory controller according to claim 1, wherein each memory device of the second-type memory comprises a DDP (Double Die Package)-type memory device in which two memory chips are packaged.

7. The memory controller according to claim 6,
wherein the control signal transfer unit is configured to selectively control one of the first-type memory and the second-type memory in response to an enable signal.

8. The memory controller according to 7,
wherein, when the enable signal is set to control the second-type memory comprising a DDP (Double Die Package)-type memory device, a second address signal is provided to the first control signal pad group and the second control pad group independent of each other.

9. The memory controller according to claim 1, wherein the control signal transfer unit comprises:
a first selection unit configured to
receive the first control signal as a first input signal,
receive the first control signal as a second input signal, and
output the first or second input signal in response to an enable signal; and
a second selection unit configured to
receive the first control signal as the first input signal,
receive the second control signal as the second input signal, and
output the first or second input signal in response to the enable signal.

10. A data storage device comprising:
a storage unit;
a buffer memory unit configured to store data inputted to/outputted from the storage unit; and
a memory controller configured to control data input/output for the buffer memory unit,
wherein the memory controller is configured to comprise a plurality of control signal pads, to operably connectable to different type memories including a first-type memory and a second-type memory via the plurality of control signal pads, and to selectively control one of the first-type memory and the second-type memory, wherein the memory controller comprises:
a control signal generation unit configured to generate a control signal comprising a first control signal and a second control signal; and
a control signal transfer unit configured to transmit directly at least one of the first control signal and the second control signal to one memory selected among the first-type memory and the second type-memory,
wherein the plurality of control signal pads are divided into a first control signal pad group and a second control signal pad group, and
the first-type memory is controlled by
applying bits of the first control signal to the first control signal pad group, and
applying bits of the second control signal to the second control signal pad group of the control signal pads, and
the second-type memory is controlled by
applying bits of the second control signal to the first control signal pad group, and
applying the second control signal to the second control signal pad group independently of the first control signal pad group.

11. The data storage device according to claim 10, wherein each of the first-type memory and the second-type memory comprises at least one memory device.

12. The data storage device according to claim 10, wherein the second-type memory comprises at least one memory device, and each of the at least one memory device comprises a DDP-type memory device in which two memory chips are packaged.

13. The data storage device according to claim 10, wherein the control signal transfer unit comprises:
a first selection unit configured to
receive the first control signal as a first input signal,
receive the first control signal as a second input signal, and
output the first or second input signal in response to an enable signal; and
a second selection unit configured to
receive the first control signal as the first input signal,
receive the second control signal as the second input signal, and
output the first or second input signal in response to the enable signal.

14. A storage system comprising:
a host device; and
a data storage device comprising:
a storage unit;
a buffer memory unit configured to store data inputted to/outputted from the storage unit; and
a controller comprising a memory controller configured to control data input/output for the buffer memory and comprising a plurality of control signal pads to selectively control different type memories including a first-type memory and a second-type memory,
wherein the memory controller comprises:
a control signal generation unit configured to generate a control signal comprising a first control signal, configured to control the first-type memory, and a second control signal, configured to control the second-type memory; and
a control signal transfer unit configured to
apply bits of the first control signal generated for controlling the first-type memory to respective control signal pads of the plurality of control signal pads,
apply bits of the second control signal generated for controlling the second-type memory to a first control signal pad group selected among the plurality of control signal pads, and apply the second control signal to a second control signal pad group selected among the plurality of control signal pads independently of the first control signal pad group, wherein the second control signal is configured by a part of the first control signal.

15. The storage system according to claim 14, wherein each of the first-type memory and the second-type memory comprises at least one memory device.

16. The storage system according to claim 14, wherein the second-type memory comprises at least one memory device, and each of the at least one memory device comprises a DDP-type memory device in which two memory chips are packaged.

17. The storage system according to claim 14, wherein the control signal transfer unit comprises:

a first selection unit configured to
receive the first control signal as a first input signal,
receive the first control signal as a second input signal, and
output the first or second input signal in response to an enable signal; and a second selection unit configured to
receive the first control signal as the first input signal,
receive the second control signal as the second input signal, and
output the first or second input signal in response to the enable signal.

* * * * *